United States Patent
Sato et al.

(10) Patent No.: US 12,405,307 B2
(45) Date of Patent: Sep. 2, 2025

(54) ABNORMALITY DETECTOR APPARATUS AND METHOD FOR DETECTING ABNORMAL STATE OF ROTARY MACHINE SUCH AS MOTOR

(71) Applicant: OMRON Corporation, Kyoto (JP)

(72) Inventors: Takahiro Sato, Kyoto (JP); Keisuke Yano, Kyoto (JP); Takahiro Nakamura, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 180 days.

(21) Appl. No.: 18/279,274

(22) PCT Filed: Feb. 16, 2022

(86) PCT No.: PCT/JP2022/006151
§ 371 (c)(1),
(2) Date: Aug. 29, 2023

(87) PCT Pub. No.: WO2022/190795
PCT Pub. Date: Sep. 15, 2022

(65) Prior Publication Data
US 2024/0151772 A1 May 9, 2024

(30) Foreign Application Priority Data
Mar. 8, 2021 (JP) ................. 2021-036620

(51) Int. Cl.
*G01R 31/34* (2020.01)
*G01R 23/16* (2006.01)
*H02P 29/024* (2016.01)

(52) U.S. Cl.
CPC ........... *G01R 31/343* (2013.01); *G01R 23/16* (2013.01); *H02P 29/024* (2013.01)

(58) Field of Classification Search
CPC ............................ G01R 31/343; G01R 23/16
See application file for complete search history.

(56) References Cited

U.S. PATENT DOCUMENTS

| 11,953,555 | B2 * | 4/2024 | Kanemaru | ........... G01R 31/343 |
| 2008/0033695 | A1 | 2/2008 | Sahara et al. | |

(Continued)

FOREIGN PATENT DOCUMENTS

| EP | 3492938 A1 | 6/2019 |
| EP | 3648338 A1 | 5/2020 |

(Continued)

OTHER PUBLICATIONS

International Search Report for International Application No. PCT/JP2022/006151; Mailing Date, Apr. 19, 2022.

(Continued)

*Primary Examiner* — Alesa Allgood
(74) *Attorney, Agent, or Firm* — CANTOR COLBURN LLP

(57) ABSTRACT

In an abnormality detector apparatus, a signal processor unit performs frequency analysis on data of a current or a voltage in different first and second time intervals to retrieve a first drive frequency corresponding to a maximum peak value of a spectrum in the first time interval and a second drive frequency corresponding to a maximum peak value of a spectrum in the second time interval; adjusts a frequency axis of one spectrum such that the maximum peak values coincide with each other, and calculates an averaged spectrum relating to the adjusted and unadjusted spectra; and retrieve an abnormal peak value equal to or more than a predetermined threshold value at a frequency different from the drive frequency having the maximum peak value based (Continued)

on the averaged spectrum; and determine an abnormal state of the motor depending on presence or absence of the abnormal peak value.

10 Claims, 6 Drawing Sheets

(56) References Cited

U.S. PATENT DOCUMENTS

| | | |
|---|---|---|
| 2019/0178705 A1 | 6/2019 | Kishi et al. |
| 2020/0217895 A1 | 7/2020 | Kanemaru et al. |
| 2020/0341447 A1 | 10/2020 | Oshima et al. |

FOREIGN PATENT DOCUMENTS

| | | |
|---|---|---|
| JP | 2019100975 A | 6/2019 |
| JP | 2020176998 A | 10/2020 |
| JP | 6824494 B1 | 1/2021 |
| WO | 2019082277 A1 | 5/2019 |
| WO | 2020208743 A1 | 10/2020 |

OTHER PUBLICATIONS

PCT Written Opinion of the International Searching Authority for International Application No. PCT/JP2022/006151; Date of Mailing, Apr. 19, 2022.
EPO Extended European Search Report for corresponding EP Application No. 22766759.9; issued Dec. 17, 2024.

\* cited by examiner

ABNORMALITY DETECTOR APPARATUS AND METHOD FOR DETECTING ABNORMAL STATE OF ROTARY MACHINE SUCH AS MOTOR

CROSS REFERENCE TO RELATED APPLICATIONS

This is the U.S. national stage of application No. PCT/JP2022/006151, filed on Feb. 16, 2022. Priority under 35 U.S.C. § 119(a) and 35 U.S.C. § 365(b) is claimed from Japanese Application No. 2021-036620, filed Mar. 8, 2021, the disclosure of which is also incorporated herein by reference.

TECHNICAL FIELD

The present invention relates to an abnormality detector apparatus, and an abnormality detection method for detecting an abnormal state of a rotary machine such as a motor.

BACKGROUND ART

In a monitoring device that diagnoses a state of a motor, for example, in a case where a noise component is observed other than a peak that constantly appears when data of a motor current acquired by a sensor is subjected to frequency analysis, the noise component is determined to be in an abnormal state, and the noise component is quantified to indicate a degree of the abnormality.

For example, Patent Document 1 discloses an abnormality detector apparatus capable of specifying a frequency corresponding to a period of a sound generated by rotation based on a sound signal even in a case where periodic noise exists. This abnormality detector apparatus detects an envelope of a sound signal representing a periodic sound emitted from a rotating body having a predetermined number of blades and a periodic sound emitted from another object, calculates a frequency spectrum of the sound signal for each frame from the envelope, and detects, for each frame, a candidate for a frequency corresponding to a period of the sound emitted from the rotating body in the frame. Next, for each frame, the duration in which the fluctuation of the power with respect to the power of the component of the frequency spectrum in the candidate detected for the frame becomes equal to or less than a certain value is obtained, and the candidate having the longest duration is specified as the frequency corresponding to the period of the sound emitted from the rotating body.

PRIOR ART DOCUMENT

Patent Document

Patent Document 1: Japanese patent laid-open publication No. JP2019-100975A

SUMMARY OF THE INVENTION

Problems to be Solved by the Invention

However, in the above-described related art, it is assumed that the rotation speed of the motor is constant, and if the drive frequency of the motor fluctuates during the measurement period, it is difficult to separate a peak that constantly appears and a noise component. As a result, there is a problem that a peak that constantly appears is determined as a noise component, and the degree of abnormality of the diagnosis result becomes high.

In order to obtain a correct diagnosis result, a user has to keep the rotation speed of the motor constant at least during the measurement for diagnosis. In addition, in a case where the degree of abnormality of the diagnosis result becomes large, it is necessary for the user to determine whether or not the abnormality is actually caused by the abnormality of the motor or the change in the rotational speed of the motor.

An object of the present invention is to solve the above problems and to provide an abnormality detector apparatus and an abnormality detection method capable of detecting an abnormal state of a motor with higher accuracy than in the related art.

Solutions to the Problems

According to the present invention, there is provided an abnormality detector apparatus that detects an abnormal state of a motor based on a current or a voltage supplied from a power supply to the motor. The abnormality detector apparatus includes a signal processor unit configured to:

perform frequency analysis on data of the current or the voltage in different first and second time intervals to retrieve a first drive frequency corresponding to a maximum peak value of a spectrum in the first time interval and a second drive frequency corresponding to a maximum peak value of a spectrum in the second time interval;

adjust, based on a first spectrum having the first drive frequency and a second spectrum having the second drive frequency, a frequency axis of one spectrum such that the maximum peak values of the respective spectra coincide with each other, and then calculate an averaged spectrum relating to an adjusted spectrum and an unadjusted spectrum; and retrieve an abnormal peak value equal to or more than a predetermined threshold value at a frequency different from the drive frequency having the maximum peak value based on the averaged spectrum, and then determine an abnormal state of the motor depending on presence or absence of the abnormal peak value.

Effects of the Invention

Therefore, according to the abnormality detector apparatus and the like of the present invention, it is possible to detect the abnormal state of the motor with higher accuracy than in the related art.

DETAILED DESCRIPTION

Figure 1:
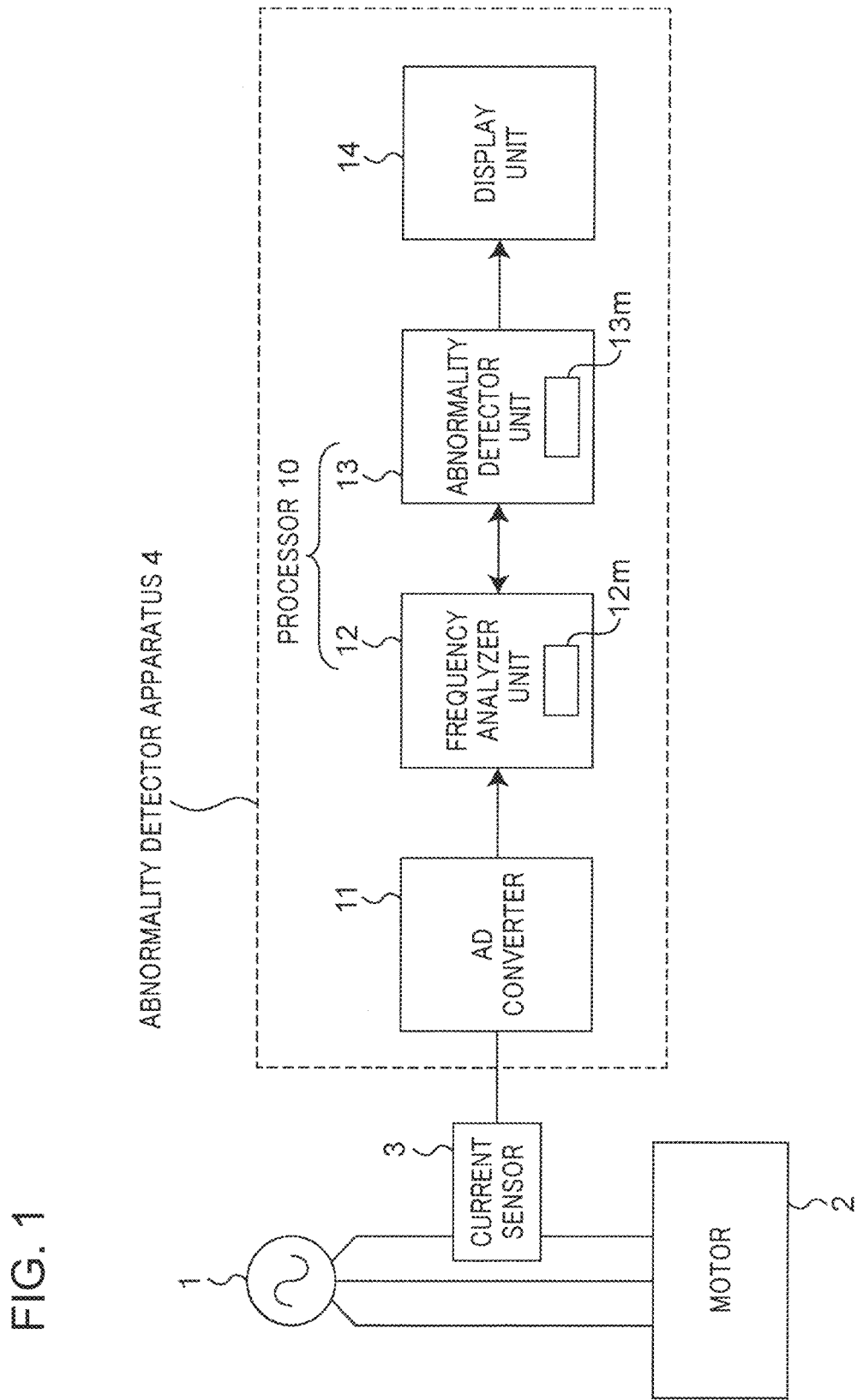
FIG. 1 is a block diagram showing a configuration example of an abnormality detector apparatus 4 for a motor according to a first embodiment.

Hereinafter, embodiments according to the present invention will be described with reference to the drawings. It is noted that the same or similar components are denoted by the same reference numerals.

First Embodiment

FIG. 1 is a block diagram showing a configuration example of an abnormality detector apparatus 4 for a motor according to a first embodiment. FIG. 1 shows an abnormality detector apparatus 4 and its peripheral circuit, and AC power from an AC power supply 1 is supplied to a motor 2 via a current sensor 3. Referring to FIG. 1, the abnormality detector apparatus 4 includes an AD converter 11, a processor 10 that includes a frequency analyzer unit 12 and an abnormality detector unit 13 and constitutes a "signal processor unit", and a display unit 14. In this case, the frequency analyzer unit 12 and the abnormality detector unit 13 have memories 12m and 13m, respectively.

Referring to FIG. 1, the current sensor 3 detects the current value of the current supplied from the AC power supply 1 to the motor 2, and outputs a detection signal indicating the current value to the AD converter 11. The AD converter 11 performs AD conversion on the input detection signal into current data indicating a current value, and then outputs the current data to the frequency analyzer unit 12. The frequency analyzer unit 12 executes fast Fourier transform (FFT) processing on the input current data over a predetermined time interval T1 and two divided time intervals T2 and T3. The abnormality detector unit 13 determines an abnormal state of the motor based on the spectrum after the FFT processing and displays the determination result on the display unit 14. Specifically, the processor 10 including the frequency analyzer unit 12 and the abnormality detector unit 13 executes abnormality detection processing of FIG. 2 to determine the abnormal state of the motor and displays the determination result on the display unit 14.

Figure 2:
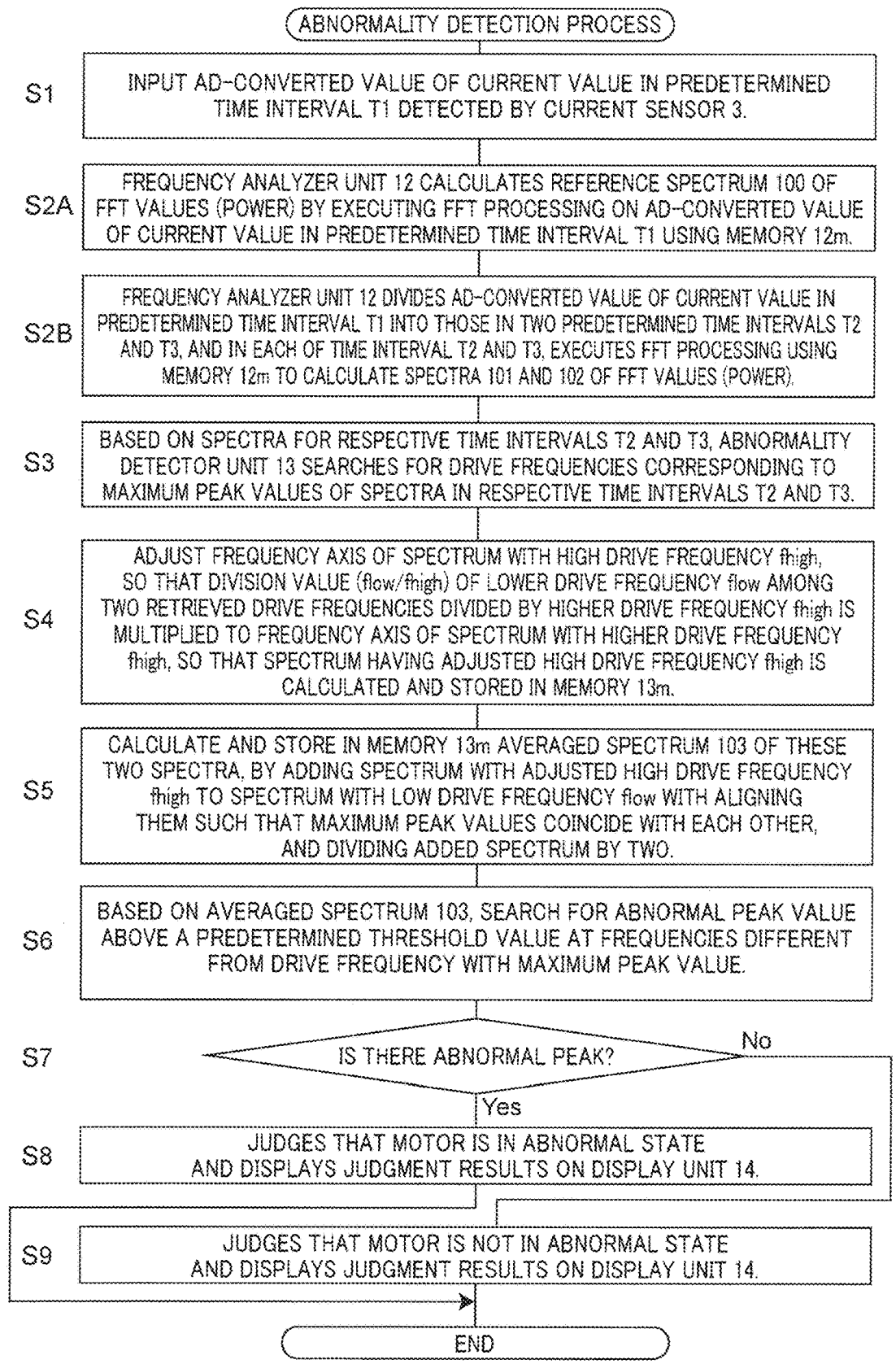
FIG. 2 is a flowchart showing abnormality detection processing executed by a processor 10 of FIG. 1.
Figure 3:
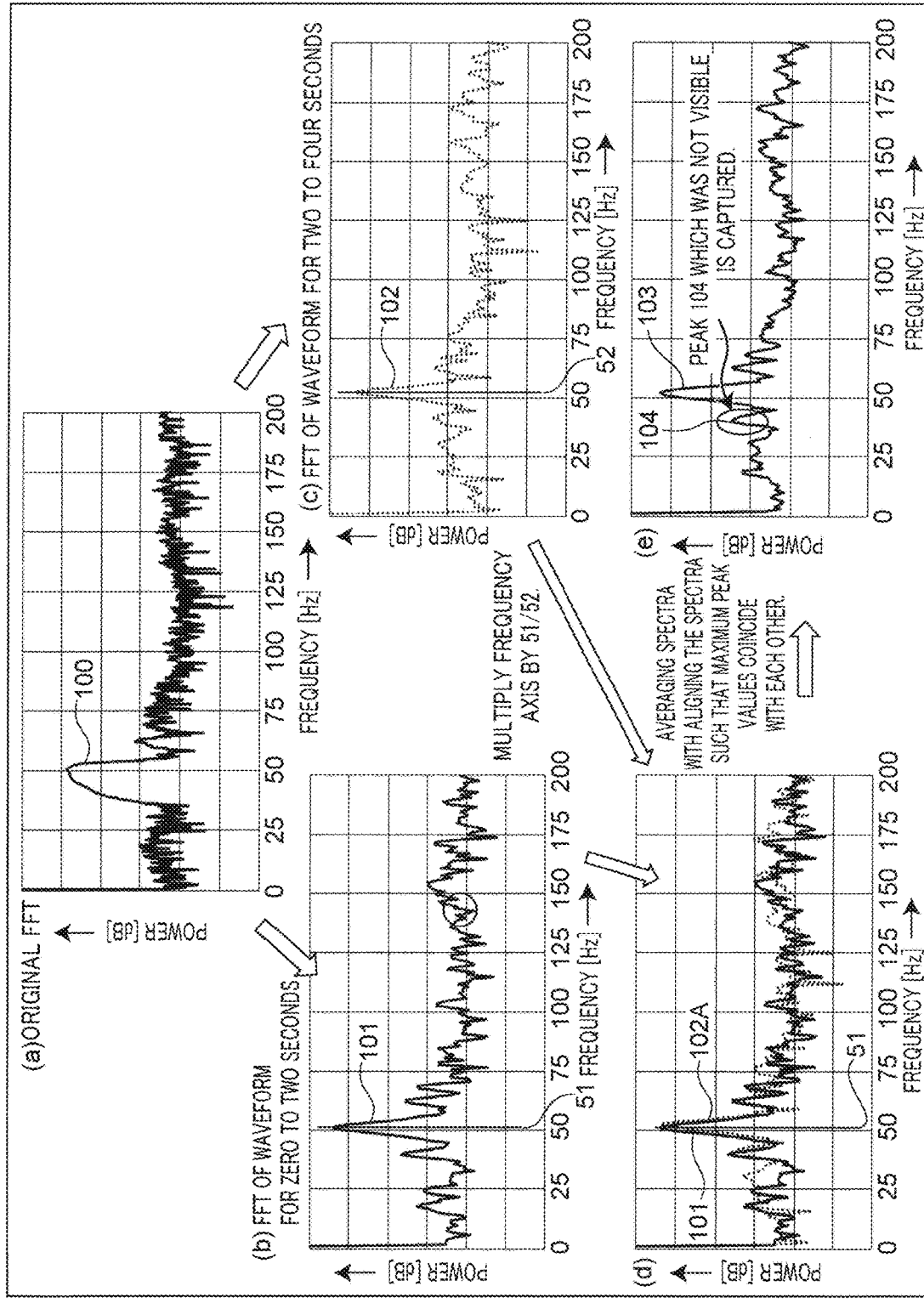
FIG. 3 is a graph showing an example of a plurality of spectra of a motor current calculated when the abnormality detection processing of FIG. 2 is executed by the processor 10 of FIG. 1.

FIG. 2 is a flowchart showing the abnormality detection processing executed by the processor 10 of FIG. 1. Further, FIG. 3 is a graph showing an example of a plurality of spectra of the motor current calculated when the abnormality detection processing of FIG. 2 is executed by the processor 10 of FIG. 1.

Hereinafter, the abnormality detection processing according to the first embodiment will be described with reference to FIG. 2 and FIG. 3.

In step S1 of FIG. 2, current data of the AD converted value in the predetermined time interval T1 detected by the current sensor 3 is input. In step S2A, the frequency analyzer unit 12 executes FFT processing on the AD converted value of the current value in the predetermined time interval T1 using the memory 12m to calculate a reference spectrum 100 (FIG. 3(a)) of the FFT value (power). In step S2B, the AD converted value of the current value in the predetermined time interval T1 is divided into those in two predetermined time intervals T2 and T3, and the FFT processing is executed using the memory 12m in each of the time intervals T2 and T3 to calculate the spectra 101 and 102 (FIGS. 3(b) and (c)) of the FFT value (power).

Next, in step S3, the abnormality detector unit 13 retrieves a drive frequency corresponding to the maximum peak value in each of the time intervals T2 and T3 based on the spectrum in each of the time intervals T2 and T3. It is noted that the processing of steps S3 to S9 is executed by the abnormality detector unit 13. In step S4, the frequency axis of the spectrum 102 having the high drive frequency $f_{high}$ is changed so as to multiply the frequency axis of the spectrum 102 having the high drive frequency $f_{high}$ by the division value ($f_{low}/f_{high}$) obtained by dividing the low drive frequency $f_{low}$ (In FIG. 3, $f_{low}$=51 Hz) by the high drive frequency $f_{high}$ (In FIG. 3, $f_{high}$=52 Hz) among the two retrieved driving frequencies, so that the adjusted spectrum 102A (FIG. 3(d)) having the high drive frequency $f_{high}$ is calculated and stored in the memory 13m. Next, in step S5, the adjusted spectrum 102A having the high drive frequency $f_{high}$ and the spectrum 101 having the low drive frequency $f_{low}$ are added such that the maximum peak values coincide with each other and divided by 2, so that an averaged spectrum 103 (FIG. 3(e)) of these two spectra is calculated and stored in the memory 13m.

Next, in step S6, the abnormality detector unit 13 retrieves a peak value of an abnormal peak 104 equal to or more than a predetermined threshold value at a frequency different from the drive frequency having the maximum peak value based on the averaged spectrum 103 ((e) of FIG. 3). In this case, the abnormal peak 104 has, for example, a peak value having the second or third strongest power after the maximum peak. Further, in step S7, the abnormality detector unit 13 determines whether or not there is an abnormal peak, and proceeds to step S8 when YES, and proceeds to step S9 when NO. In step S8, it is determined that the motor is in an abnormal state, the determination result is displayed on the display unit 14, and the abnormality detection processing is ended. Further, in step S9, it is determined that the motor is not in an abnormal state, the determination result is displayed on the display unit 14, and the abnormality detection processing is ended.

In the abnormality detection processing of FIG. 2, the time interval T1 is divided into two time intervals T2 and T3 and the frequency analysis is performed on the current data of the drive current of the motor acquired in the predetermined time interval T1, and the drive frequency having the maximum value of the peak value in each of the two divided time intervals T2 and T3 is retrieved. The frequency axis of the spectrum of the result of the frequency analysis having the high drive frequency is multiplied by the division value obtained by dividing the low drive frequency by the high drive frequency based on the low drive frequency and the high drive frequency of the two retrieved driving frequencies and is added to the spectrum of the result of the frequency analysis having the low drive frequency to be averaged.

For example, in the example of FIG. 3, in a case where the peak of the characteristic of the abnormality slows down or slackens because the drive frequency fluctuates in the data for 4 seconds, for example, FFT for 0 to 2 seconds and frequency analysis for 2 seconds to 4 seconds are executed, and when the frequencies of the maximum peaks are 51 Hz and 52 Hz, respectively, a spectrum obtained by multiplying the frequency axis of 52 Hz by 51/52 and a spectrum of the result of the frequency analysis of 51 Hz are added and averaged. As a result, the characteristic of the abnormality appears sharply, and the feature of the abnormality can be captured with higher sensitivity and accuracy than the envelope FFT.

As described above, as shown in FIG. 3(e), the peak 104 (FIG. 3(e)) that is not visible in the related art can be captured by performing the abnormality detection processing of FIG. 2. In particular, in a case where the drive frequency fluctuates, it is easy to separate a peak that constantly appears and a noise component, and the abnormality detection processing can be performed with higher accuracy than the related art.

Second Embodiment

Figure 4A:
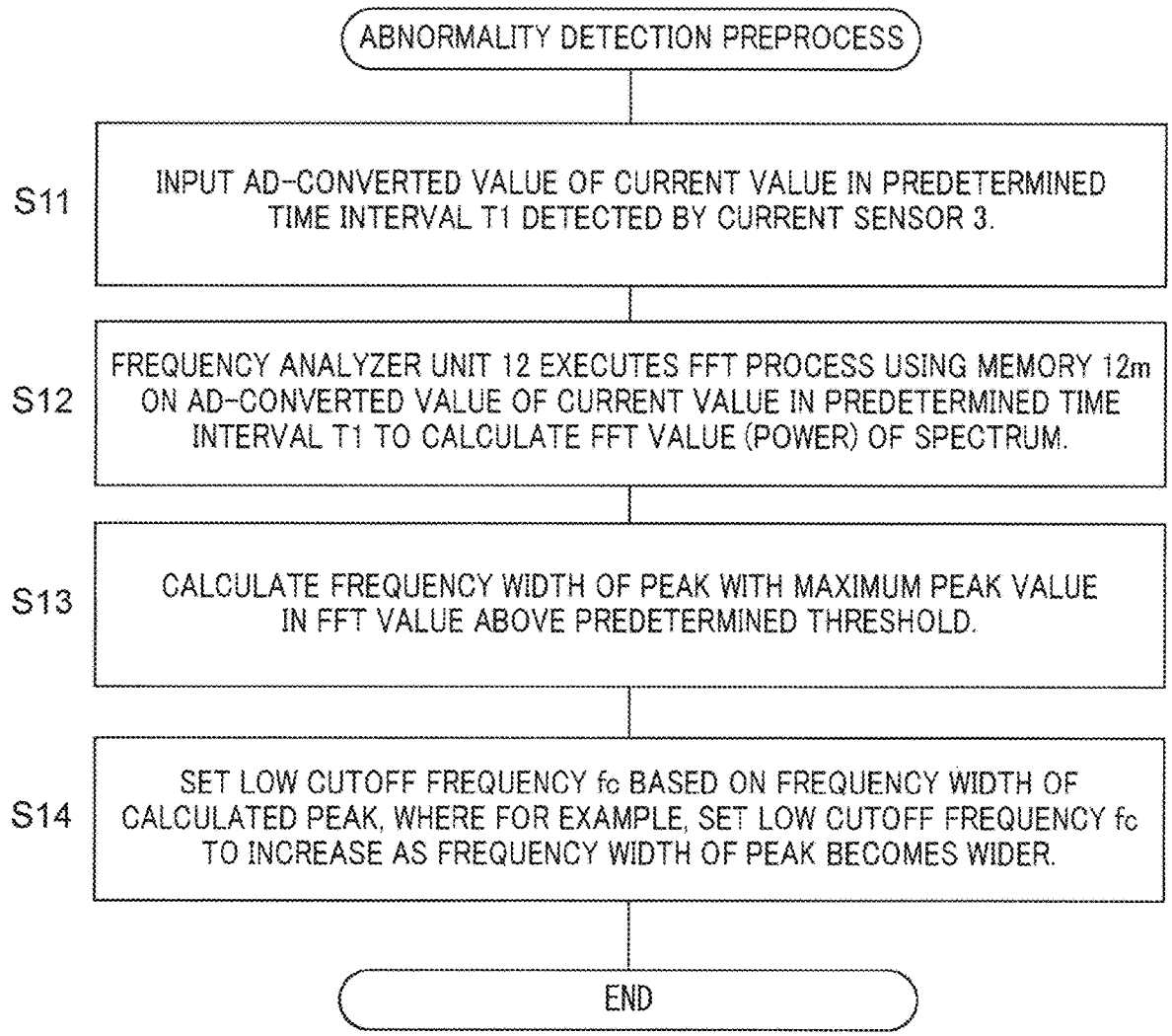
FIG. 4A is a flowchart showing abnormality detection pre-processing executed by a processor 10 of an abnormality detector apparatus 4 for a motor according to a second embodiment.
Figure 4B:
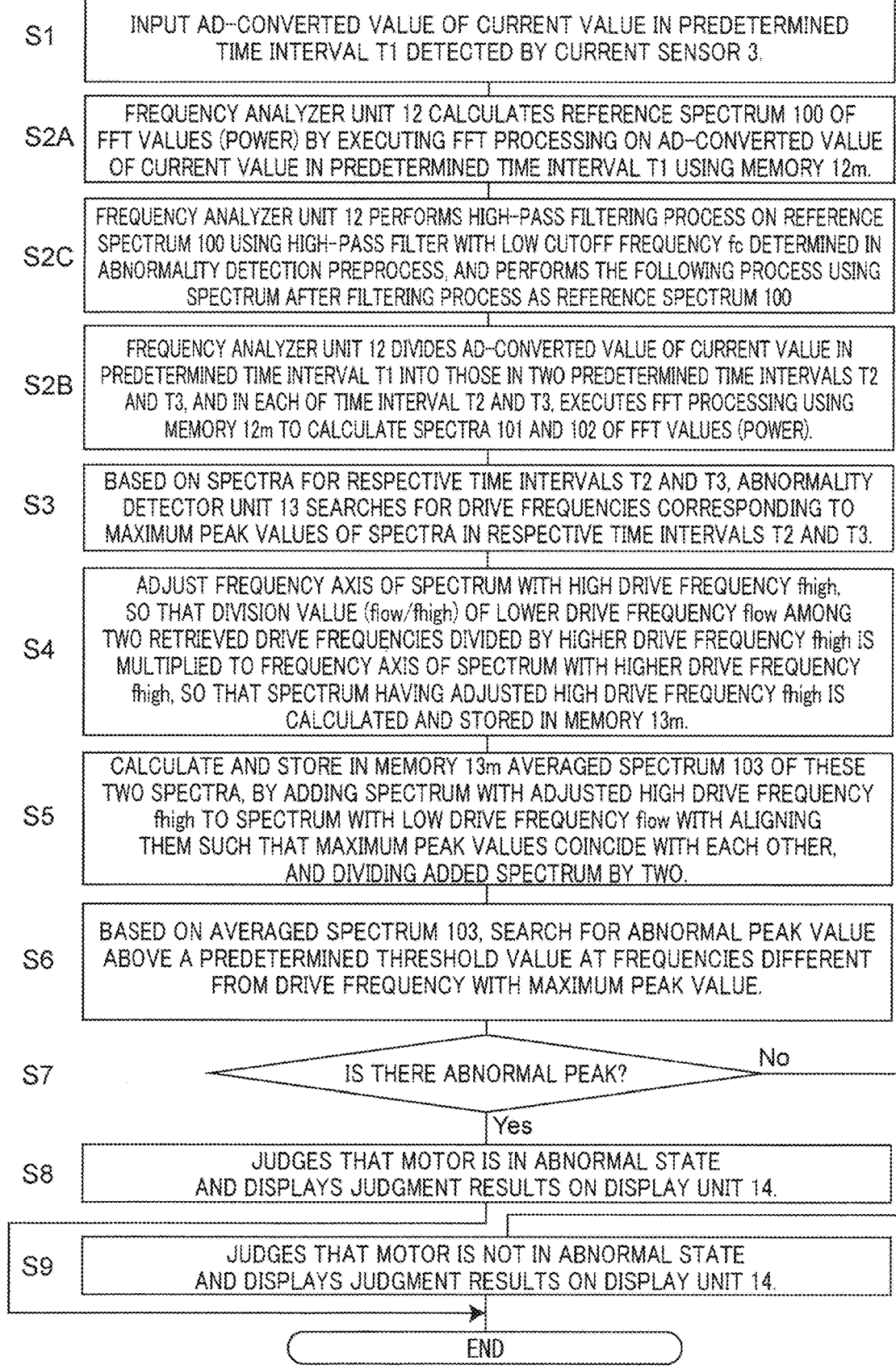
FIG. 4B is a flowchart showing abnormality detection processing executed by the processor 10 of the abnormality detector apparatus 4 for a motor according to the second embodiment.

FIG. 4A is a flowchart showing abnormality detection pre-processing executed by a processor 10 of an abnormality detector apparatus 4 for a motor according to a second embodiment. Further, FIG. 4B is a flowchart showing abnormality detection processing executed by the processor 10 of the abnormality detector apparatus 4 for a motor according to the second embodiment. The abnormality detection processing according to the second embodiment is different from the abnormality detection processing according to the first embodiment in the following points. It is noted that the abnormality detector apparatus 4 is configured similarly to FIG. 1.

(1) The abnormality detection pre-processing of FIG. 4A is executed before the abnormality detection processing of FIG. 4B, so that an abnormality detector unit 13 calculates a peak width (frequency width) having a maximum peak value at an FFT value equal to or more than a predetermined threshold value, determines a low-frequency cutoff frequency fc based on the calculated peak width, and stores the low-frequency cutoff frequency fc in a memory 13m.

(2) The abnormality detection processing of FIG. 4B is characterized as compared with the abnormality detection processing of FIG. 2 in that the processing of step S2C is inserted between steps S2A and S2B.

Differences will be described below.

In step S11 of the abnormality detection pre-processing of FIG. 4A, an AD converted value of a current value in a predetermined time interval T1 detected by a current sensor 3 is input. Next, in step S12, a frequency analyzer unit 12 executes FFT processing on the AD converted value of the current value in the predetermined time interval T1 using a memory 12m to calculate a spectrum of the FFT value (power). Furthermore, in step SS13, the frequency width of the peak having the maximum peak value is calculated at the FFT value equal to or more than the predetermined threshold value, and in step S14, the low-frequency cutoff frequency fc is set based on the calculated frequency width of the peak, and the abnormality detection pre-processing is terminated.

It is noted that, in step S14, the detection sensitivity of the low-frequency cutoff frequency fc is increased by setting the low-frequency cutoff frequency fc such that the low-frequency cutoff frequency fc increases as the calculated peak width (frequency width) increases, for example.

In step S2C of the abnormality detection processing of FIG. 4B, filtering processing is performed by a high-pass filter having the low-frequency cutoff frequency fc determined in the abnormality detection pre-processing in a reference spectrum 100, and the processing of steps S2B to S9 is executed similarly to FIG. 2 with the spectrum after the filtering processing as the reference spectrum 100.

Figure 5A:
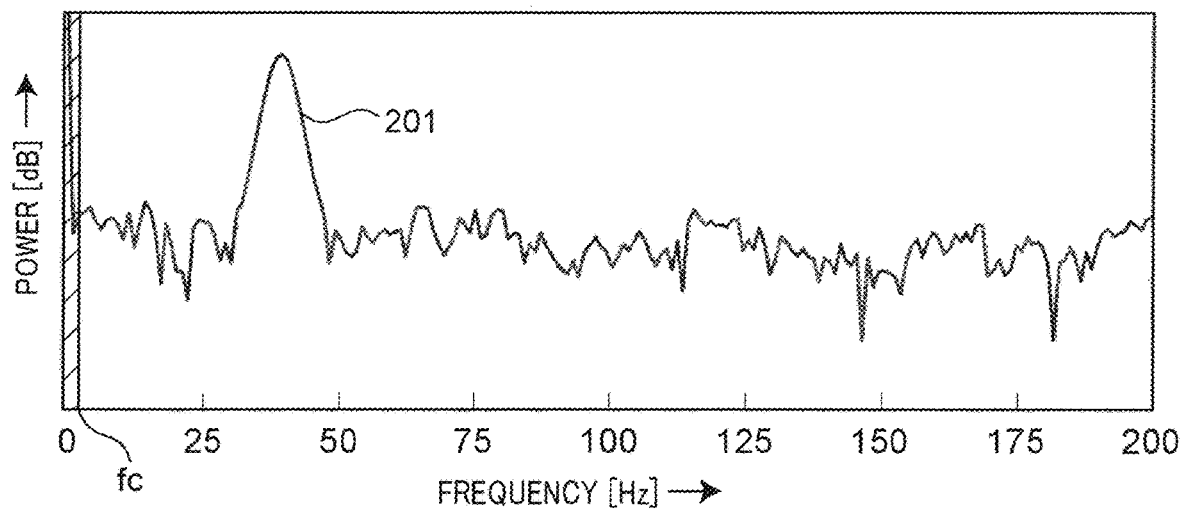
FIG. 5A is a graph showing a first example of a spectrum of a motor current calculated when the abnormality detection processing of FIG. 4B is executed by the processor 10 of FIG. 1.
Figure 5B:
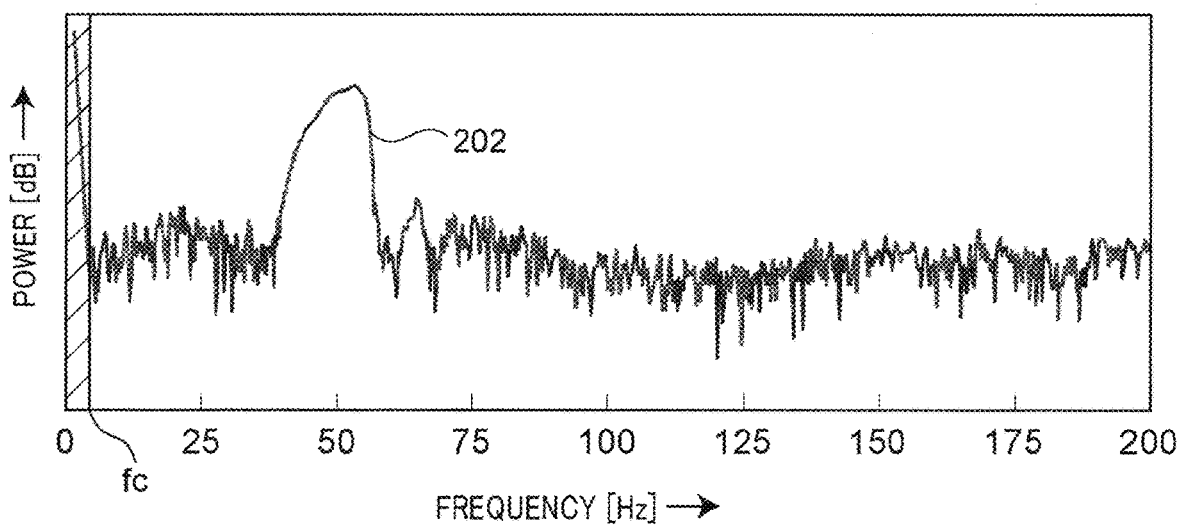
FIG. 5B is a graph showing a second example of a spectrum of a motor current calculated when the abnormality detection processing of FIG. 4B is executed by the processor 10 of FIG. 1.

FIG. 5A is a graph showing a first example of a spectrum of a motor current calculated when the abnormality detection processing of FIG. 4B is executed by the processor 10 of FIG. 1. Further, FIG. 5B is a graph showing a second example of a spectrum of a motor current calculated when the abnormality detection processing of FIG. 4B is executed by the processor 10 of FIG. 1.

In the second embodiment, when a current data of a drive current of the motor is subjected to frequency analysis to capture a characteristic of a motor abnormality, an extra DC component and a low-frequency component in the vicinity thereof are cut, that is, high-pass filtering is performed. In this case, when the drive frequency of the motor fluctuates, the DC component and the frequency width in the vicinity thereof may increase, and a part thereof cannot be cut and is regarded as a characteristic of an abnormality. Therefore, the bandwidth for cutting the low-frequency component is adjusted in accordance with the degree of fluctuation of the drive frequency, and the detection sensitivity is increased. For example, as shown in a spectrum and 201 of FIG. 5A, when the fluctuation amount of the drive frequency is within ±0.5 Hz, the low-frequency cutoff frequency fc is set to 1 Hz. In addition, as shown in a spectrum 202 of FIG. 5B, when the fluctuation amount of the drive frequency is within ±1.0 Hz, it is preferable to set the low-frequency cutoff frequency fc to 2 Hz.

As described above, according to the second embodiment, in the abnormality detection processing of the first embodiment, the calculated spectrum is subjected to high-pass filtering using the predetermined low-frequency cutoff frequency fc, so that the extra DC component and low-frequency component are cut. Here, the detection sensitivity of the low-frequency cutoff frequency fc can be increased by setting the low-frequency cutoff frequency fc such that the low-frequency cutoff frequency fc increases as the calculated frequency width of the peak increases. As a result, in a case where the drive frequency fluctuates, it is easy to separate a peak that constantly appears and a noise component, and the abnormality detection processing can be performed with higher accuracy than the related art.

Modified Embodiments

In the above embodiment, the current data of the current supplied from the AC power supply to the motor is subjected to the frequency analysis to determine the abnormal state of the motor, but the present invention is not limited thereto, and the voltage data of the voltage supplied from the AC power supply to the motor may be subjected to the frequency analysis to similarly determine the abnormal state of the motor.

In the above embodiment, the frequency axis of the spectrum having the high drive frequency is adjusted so as to multiply the frequency axis of the spectrum having the high drive frequency by the division value obtained by dividing the low drive frequency by the high drive frequency among the two driving frequencies including the first and second driving frequencies, so that the adjusted spectrum having the high drive frequency is calculated. Then, the averaged spectrum is calculated based on the adjusted spectrum having the high drive frequency and the spectrum having the low drive frequency such that the maximum peak values of the two spectra coincide with each other. However, the present invention is not limited thereto, and the frequency axis of the spectrum having the low drive frequency may be adjusted so as to multiply the frequency axis of the spectrum having the low drive frequency by the division value obtained by dividing the high drive frequency by the low drive frequency among the first and second driving frequencies, so that the adjusted spectrum having the low drive frequency is calculated, and the averaged spectrum may be calculated based on the adjusted spectrum having the low drive frequency and the spectrum having the high drive frequency such that the maximum peak values of the two spectra coincide with each other.

Therefore, in the present invention, based on the first spectrum having the first drive frequency and the second spectrum having the second drive frequency, the frequency axis of one spectrum may be adjusted such that the maximum peak values of the respective spectra coincide with each other, and then the averaged spectrum regarding the adjusted spectrum and the unadjusted spectrum may be calculated.

INDUSTRIAL APPLICABILITY

As described above in detail, according to the present invention, in a case where the drive frequency fluctuates, it is easy to separate the peak that constantly appears and the noise component, and the abnormality detection processing can be performed with higher accuracy than the related art.

The invention claimed is:

1. An abnormality detector apparatus that detects an abnormal state of a motor based on a current or a voltage supplied from a power supply to the motor, the abnormality detector apparatus comprising a signal processor unit configured to:
   perform frequency analysis on data of the current or the voltage in different first and second time intervals to retrieve a first drive frequency corresponding to a maximum peak value of a spectrum in the first time interval and a second drive frequency corresponding to a maximum peak value of a spectrum in the second time interval;
   adjust, based on a first spectrum having the first drive frequency and a second spectrum having the second drive frequency, a frequency axis of one spectrum such that the maximum peak values of the respective spectra coincide with each other, and then calculate an averaged spectrum relating to an adjusted spectrum and an unadjusted spectrum; and
   retrieve an abnormal peak value equal to or more than a predetermined threshold value at a frequency different from the drive frequency having the maximum peak value based on the averaged spectrum, and then determine an abnormal state of the motor depending on presence or absence of the abnormal peak value.

2. The abnormality detector apparatus as claimed in claim 1,
   wherein, when calculating the averaged spectrum, the signal processor unit is configured to:
   (1) calculate an adjusted spectrum having a high drive frequency by adjusting a frequency axis of the spectrum having the high drive frequency so as to multiply the frequency axis of the spectrum having the high drive frequency by a division value obtained by dividing a low drive frequency by the high drive frequency among the first and second driving frequencies, and then calculate the averaged spectrum based on the adjusted spectrum having the high drive frequency and the spectrum having the low drive frequency such that the maximum peak values of the two spectra coincide with each other; or
   (2) calculate an adjusted spectrum having a low drive frequency by adjusting a frequency axis of the spectrum having the low drive frequency so as to multiply the frequency axis of the spectrum having the low drive frequency by a division value obtained by dividing a high drive frequency by the low drive frequency among the first and second driving frequencies, and then calculate the averaged spectrum based on the adjusted spectrum having the low drive frequency and the spectrum having the high drive frequency such that the maximum peak values of the two spectra coincide with each other.

3. The abnormality detector apparatus as claimed in claim 1,
   wherein the signal processor unit is configured to perform high-pass filtering on the data of the current or the voltage to be subjected to frequency analysis at a predetermined low-frequency cutoff frequency before performing the frequency analysis in the first and second time intervals.

4. The abnormality detector apparatus as claimed in claim 3,
   wherein the signal processor unit is configured to perform the frequency analysis on the data of the current or the voltage in a time interval including the first and second time intervals, calculate a frequency width of a peak having a maximum peak value based on a spectrum of a result of the frequency analysis, and then set the low-frequency cutoff frequency based on the calculated frequency width of the peak.

5. The abnormality detector apparatus as claimed in claim 4,
   wherein the signal processor unit sets the low-frequency cutoff frequency to be higher as the calculated frequency width of the peak becomes wider.

6. An abnormality detection method for detecting an abnormal state of a motor based on a current or a voltage supplied from a power supply to the motor, the abnormality detection method comprising the steps of:
   performing, by a signal processor unit, frequency analysis on data of the current or the voltage in different first and second time intervals to retrieve a first drive frequency corresponding to a maximum peak value of a spectrum in the first time interval and a second drive frequency corresponding to a maximum peak value of a spectrum in the second time interval;
   adjusting, by the signal processor unit, based on a first spectrum having the first drive frequency and a second spectrum having the second drive frequency, a frequency axis of one spectrum such that the maximum peak values of the respective spectra coincide with each other, and then calculating an averaged spectrum relating to the adjusted spectrum and the unadjusted spectrum; and
   retrieving, by the signal processor unit, an abnormal peak value equal to or more than a predetermined threshold value at a frequency different from the drive frequency having the maximum peak value based on the averaged spectrum, and then determining an abnormal state of the motor depending on presence or absence of the abnormal peak value.

7. The abnormality detection method as claimed in claim 6,
   wherein, the step of calculating the averaged spectrum comprises the step of, by the signal processor unit:
   (1) calculating an adjusted spectrum having a high drive frequency by adjusting a frequency axis of the spectrum having the high drive frequency so as to multiply the frequency axis of the spectrum having the high drive frequency by a division value obtained by dividing a low drive frequency by the high drive frequency among the first and second driving frequencies, and then calculating the averaged spectrum based on the adjusted spectrum having the high drive frequency and the spectrum having the low drive frequency such that maximum peak values of the two spectra coincide with each other; or (2) calculating an adjusted spectrum having a low drive frequency by adjusting a frequency axis of the spectrum having the low drive frequency so as to multiply the frequency axis of the spectrum having the low drive frequency by a division value obtained by dividing a high drive frequency by the low drive frequency among the first and second driving frequencies, and then calculating the averaged spectrum based on the adjusted spectrum having the low drive frequency and the spectrum having the high drive frequency such that maximum peak values of the two spectra coincide with each other.

8. The abnormality detection method as claimed in claim 6, further comprising a step of performing, by the signal processor unit, high-pass filtering on the data of the current or the voltage to be subjected to frequency analysis at a predetermined low-frequency cutoff frequency before performing the frequency analysis in the first and second time intervals.

9. The abnormality detection method as claimed in claim 8, further comprising a step of performing, by the signal processor unit, frequency analysis on the data of the current or the voltage in a time interval including the first and second time intervals, calculate a frequency width of a peak having a maximum peak value based on a spectrum of a result of the frequency analysis, and set the low-frequency cutoff frequency based on the calculated frequency width of the peak.

10. The abnormality detection method as claimed in claim 9, wherein the step of setting the low-frequency cutoff frequency comprises setting the low-frequency cutoff frequency to be higher as the calculated frequency width of the peak becomes wider.

\* \* \* \* \*